(12) United States Patent
Hegyi et al.

(10) Patent No.: US 7,680,224 B2
(45) Date of Patent: Mar. 16, 2010

(54) APPARATUS AND METHOD FOR AUTOMATIC FREQUENCY CORRECTION FOR A RECEIVER SYSTEM

(75) Inventors: Andras Hegyi, Szekesfehervar (HU); Peter Onody, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 1207 days.

(21) Appl. No.: 11/211,343

(22) Filed: Aug. 25, 2005

(65) Prior Publication Data

US 2006/0045216 A1 Mar. 2, 2006

Related U.S. Application Data

(60) Provisional application No. 60/604,975, filed on Aug. 27, 2004.

(51) Int. Cl.
*H04L 27/06* (2006.01)

(52) U.S. Cl. ............ 375/344; 375/335; 375/316; 455/324; 455/258; 329/300

(58) Field of Classification Search ............ 375/344, 375/335, 316; 455/324, 258; 329/300
See application file for complete search history.

(56) References Cited

U.S. PATENT DOCUMENTS

| | | | | |
|---|---|---|---|---|
| 4,157,217 A | * | 6/1979 | Isono | 396/102 |
| 4,298,988 A | * | 11/1981 | Dages | 455/182.1 |
| 4,691,341 A | * | 9/1987 | Knoble et al. | 379/93.26 |
| 5,107,522 A | * | 4/1992 | Kitayama et al. | 375/344 |
| 5,376,894 A | * | 12/1994 | Petranovich | 329/306 |
| 5,400,366 A | * | 3/1995 | Iwamatsu | 375/344 |
| 5,530,723 A | | 6/1996 | Maplestone | |
| 5,548,619 A | * | 8/1996 | Horiike et al. | 375/344 |
| 5,594,758 A | * | 1/1997 | Petranovich | 375/344 |
| 5,781,588 A | * | 7/1998 | Abe et al. | 375/334 |
| 6,226,505 B1 | * | 5/2001 | Uda | 455/255 |
| 6,233,292 B1 | * | 5/2001 | Van Bezooijen et al. | 375/344 |
| 6,359,942 B1 | | 3/2002 | Duggan et al. | |
| 6,560,215 B1 | * | 5/2003 | Bloem et al. | 370/347 |
| 6,704,555 B2 | * | 3/2004 | Sih et al. | 455/245.1 |
| 7,315,590 B1 | * | 1/2008 | Okuyama et al. | 375/344 |
| 2004/0264620 A1 | * | 12/2004 | Tanaka | 375/375 |

OTHER PUBLICATIONS

Search Report —Application #05255269.2-2415—Dated Dec. 20, 2005 pp. 7.

* cited by examiner

*Primary Examiner*—Shuwang Liu
*Assistant Examiner*—Michael R Neff
(74) *Attorney, Agent, or Firm*—O'Keefe, Egan, Peterman & Enders LLP

(57) ABSTRACT

A system and method is shown for automatic frequency correction in a receiver, where the number of clock cycles in a baseband data signal, such as an I or Q channel of the receiver or an XOR of the I and Q channels, for a "1" state and a "0" state of a received data signal are each determined and the difference between the two is used to calculate a subsequent frequency offset correction value. The subsequent frequency offset correction value is added to a current offset correction value to obtain an actual offset correction value. The actual offset correction value is then used to adjust the frequency of the receiver clock.

14 Claims, 2 Drawing Sheets

APPARATUS AND METHOD FOR AUTOMATIC FREQUENCY CORRECTION FOR A RECEIVER SYSTEM

CROSS-REFERENCE TO RELATED PATENT APPLICATIONS

This patent application claims the benefit of U.S. Provisional Patent Application No. 60/604,975, filed Aug. 27, 2004.

FIELD OF THE INVENTION

This invention pertains to automatic frequency correction (AFC) and, more particularly, to AFC as it applies to Frequency Shift Key (FSK) modulated receiver systems.

BACKGROUND OF THE INVENTION

When working with transmitters and receivers, designers are forced to deal with the problem of frequency offset between the carrier frequencies in the two parts. In order to allow for inexpensive solutions, one should allow for the use of less accurate frequency references, such as quartz crystals. However, differences between the frequency references in the transmitter and receiver can result in transmission errors. For example, if there is an offset error ($dF_o$) between the transmitter and receiver local oscillators, then the frequencies of received down-converted mark and space signals will be different.

BRIEF SUMMARY OF THE INVENTION

An embodiment of an automatic frequency control circuit for a receiver circuit, the circuit includes a first time measurement timer with a clock input configured to receive a reference clock signal, an enable input configured to receive a received data signal, and a ready output configured to become active when the first time measurement timer counts a predetermined number of reference clock cycles when the first time measurement timer is enabled, where the first time measurement timer is enabled responsive to a first logic state of the received data signal. A second time measurement timer has a clock input configured to receive the reference clock signal, an enable input configured to receive the received data signal, and a ready output configured to become active when the second time measurement timer counts the predetermined number of reference clock cycles when the second time measurement timer is enabled, where the second time measurement timer is enabled responsive to a second logic state of the received data signal. A first counter has a clock input configured to receive a baseband data signal of the receiver, an enable input configured to receive the received data signal, a stop input coupled to the ready output of the first time measurement timer, and an output for a count value of the first counter, where the first counter is enabled responsive to the first logic state of the received data signal. A second counter has a clock input configured to receive the baseband data signal, an enable input configured to receive the received data signal, a stop input coupled to the ready output of the second time measurement timer, and an output for a count value of the second counter, where the second counter is enabled responsive to the second logic state of the received data signal. A subtractor has a first input coupled to the output of the first counter and a second input coupled to the output of the second counter, and an output for a difference of the count values of the first and second counters. An AND logic gate has a first input coupled to the ready output of the first time measurement counter, a second input coupled to the ready output of the second time measurement counter, and an output. A first latch has an input, an enable input coupled to the output of the AND logic gate, and an output. A second latch has an input coupled to the output of the first latch, an enable input configured to receive a control signal, and an output. And an adder has a first input coupled to the output of the subtractor, a second input coupled to the output of the second latch, and an output coupled to the input of the first latch. In a further refinement of this embodiment, the control signal to the second latch is provided by a controller. In another refinement, the controller is configured to receive the output from the second latch, cause the value at the output of the second latch to be added to a stored frequency value for a PLL of the receiver to obtain a corrected frequency value, and output the corrected frequency value to the PLL of the receiver. In still other refinements, the baseband data signal may be an I baseband data signal channel of the receiver, a Q baseband data signal channel of the receiver, or an XOR of the I and Q baseband data signal channels.

An embodiment of a method for automatic frequency correction in a receiver calls for recovering a received data signal from a baseband data signal. The method includes counting a predetermined number of reference clock cycles during a "1" state of the received data signal to measure a "1" time interval and counting the number of transitions in the baseband data signal during the "1" time interval to obtain a "1" count value. The method also recites counting a predetermined number of reference clock cycles during a "0" state of the received data signal to measure a "0" time interval and counting the number of transitions in the baseband data signal during the "0" time interval to obtain a "0" count value. The method then calls for determining a difference between the "1" and "0" count values to obtain a difference value, adding the difference value to a current offset value to obtain an actual offset value, and latching the actual offset value when the "1" and "0" time intervals have been measured. Finally, the method involves outputting the actual offset value responsive to a control signal. A further refinement of the method calls for adding the actual offset value to a stored frequency control value to obtain a corrected frequency control value and controlling a frequency synthesizer for the receiver using the corrected frequency control value. In another refinement, the method involves initiating automatic frequency correction in the receiver responsive to a valid data indicator signal. In still another refinement, the baseband data signal is an I baseband data signal channel of the receiver, a Q baseband data signal channel of the receiver, or an exclusive ORing of the I and Q baseband data signal channels. In yet another refinement, the baseband data signal is an I baseband data signal channel of the receiver, a Q baseband data signal channel of the receiver, or an exclusive ORing of the I and Q baseband data signal channels.

An embodiment of a system for automatic frequency correction in a receiver includes circuitry for determining a number of transitions in a received baseband data signal for a "1" state of a received data signal, where the received data signal and is derived from the received baseband data signal and for determining a number of transitions in the received baseband data signal for a "0" state of the received data signal. The system also includes circuitry for calculating a difference between the number of transitions in the received baseband data signal for a "1" state of the received data signal and the number of transitions in the received baseband data signal for a "0" state of the received data signal to obtain a subsequent frequency offset correction value. The system is configured to add the subsequent frequency offset correction value to a current frequency offset correction value to obtain an actual frequency correction value and to capture and store the actual frequency correction value. The actual frequency correction value is then used to control the receiver clock frequency. A further refinement of this embodiment includes circuitry for detecting valid data in the received data signal and the system is configured to initiate automatic frequency correction responsive to detecting valid data in the received data signal.

BRIEF DESCRIPTION OF THE DRAWINGS

Certain embodiments will be described with reference to the following drawings, wherein.

DETAILED DESCRIPTION OF THE INVENTION

In the present invention, an intelligent circuit is implemented to correct the frequency in the receiver to reduce an offset error ($dF_O$) between the transmitter and receiver local oscillators that would otherwise degrade the receiver performance.

For example, in direct conversion architectures, the frequency of the base band signal is generally equal to the frequency deviation and the transmitter and receiver local oscillators run at the same frequency. If there is an offset error ($dF_O$) between the transmitter and receiver local oscillators, then the frequencies of received down-converted mark "1" and space "0" signals will be different. By evaluating this difference, e.g. determining an error term corresponding to the offset error, it is possible to tune the local oscillator frequency of the receiver in order to reduce or cancel the frequency offset error. In a fractional N-type phase-locked loop (PLL), for example, this can be realized by adding the error term to the frequency value, which is typically a digital value that is available within the receiver system.

Figure 1:
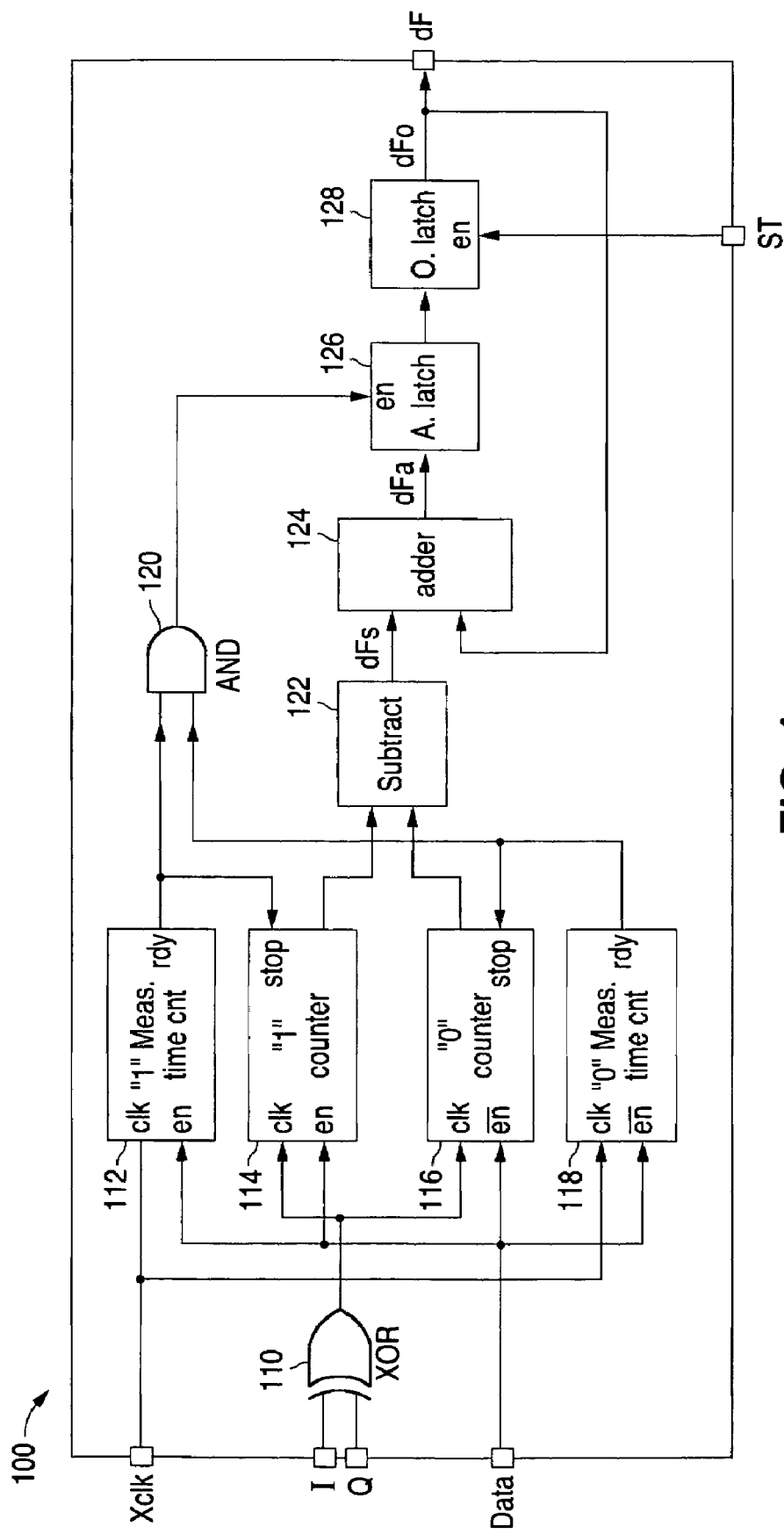
FIG. 1 is a logic circuit diagram illustrating an example of an automatic frequency correction circuit.

FIG. 1 is a functional block diagram illustrating a preferred embodiment of an automatic frequency correction (AFC) circuit block 100 that counts the rising and falling edges in a filtered I⊕Q signal coming from base band filters of a receiver circuit. In alternative embodiments, instead of XOR-ing the I and Q channels, either the I or Q channel by itself is used to drive the clock inputs of "1" counter 114 and "0" counter 116. In all the embodiments, the number of transitions in a baseband data signal, e.g. I, Q, or I XOR Q, during a logical "1" and logical "0" of a received data signal are counted in order to calculate a frequency correction.

Figure 2:
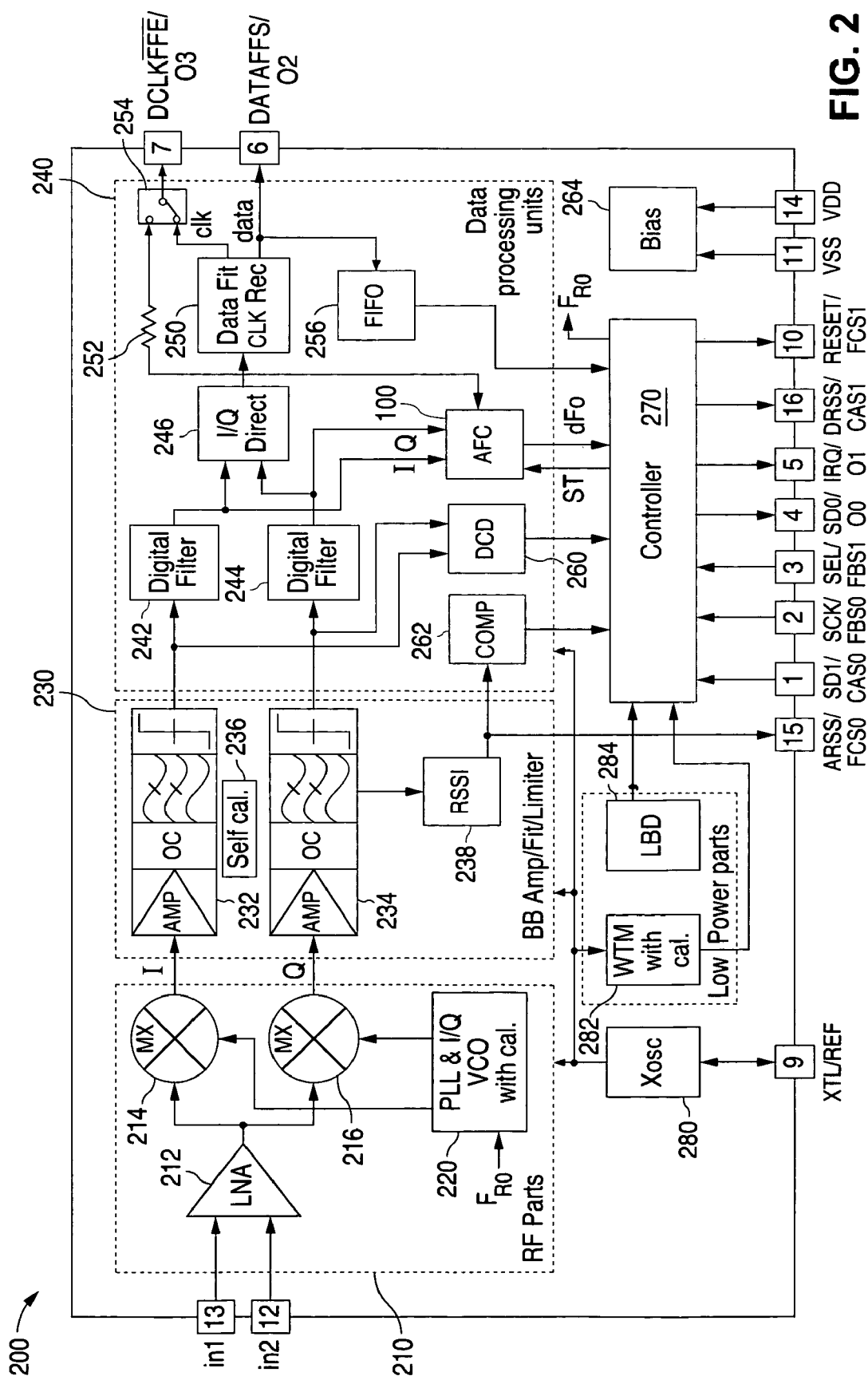
FIG. 2 is a functional block diagram illustrating an example of a receiver utilizing the AFC circuit of FIG. 1.

The edges are counted separately during the zero and one states of the demodulated data using separate counters. In one embodiment, the "1" and "0" measurement time counters will start to count when a bit in an AFC control word is set so that the correction can be controlled either externally, by a processor, or internally, by an on-chip controller, as illustrated in FIG. 2, for example. The counters are stopped by the measurement time counters, which are counting the reference clock, e.g. a crystal oscillator 10 MHz clock, as long as they reach the preprogrammed value, which is dependent on the frequency resolution of a Phased-locked Loop (PLL), where the counting period is selected to provide offset error dF resolution equal to the frequency resolution in the PLL.

In the example of FIG. 1, the I and Q baseband data signals are input to an exclusive-OR (XOR) gate 110. The output of XOR gate 110, which is also a baseband data signal, drives the clock inputs of a "1" counter 114 and a "0" counter 116. The "1" counter 114 is stopped by a "1" state measurement counter 112 that counts the number of reference clock cycles XCLK during a "1" state of a DATA signal of the receiver, where the DATA signal enables both "1" measurement time counter 112 and "1" counter 114 when the DATA signal is a logical "1". The reference clock signal XCLK is used to drive a clock input CLK of measurement time counter 112. The DATA signal is input to active logic high enable inputs of both counters 112 and 114.

Similarly, "0" counter 116 is stopped by a "0" state measurement counter 118 that counts the number of reference clock cycles XCLK during a "0" state of the DATA signal of the receiver, where the DATA signal enables both "0" measurement time counter 118 and "0" counter 116 when the DATA signal is a logical "0". The reference clock signal XCLK is used to drive a clock input CLK of "0" measurement time counter 118. The DATA signal is input to active logic low enable inputs of both counters 116 and 118.

When "1" measurement time counter 112 reaches a predetermined count, it will activate an output RDY that stops "1" counter 114 and is input to AND gate 120. This determines the number of receive clock signal XCLK cycles during a "1" state of the received data signal. When "0" measurement time counter 118 reaches another predetermined count, it will activate its output RDY that stops "0" counter 116 and is also input to AND gate 120. This determines the number of receive clock signal XCLK cycles during a "0" state of the received signal. Subtractor 122 subtracts the values of "1" counter 114 and "0" counter 116 to produce a subsequent offset error $dF_S$ that is a difference reflecting the frequency offset error at the current receiver frequency. Adder 124 adds the subsequent offset error $dF_S$ to a current output offset error $dF_O$ to produce an actual offset error $dF_A$. The output of gate 120 is used to enable latch 126 and capture a value of $dF_A$ derived from measuring the clock number of reference clock XCLK cycles during the "0" and "1" states of the DATA signal.

As noted above, the clock inputs of "1" counter 114 and "0" counter 116 may alternatively receive either the I or Q channel by itself. However, the measurement time of the "1" measurement timer 112 and the "0" measurement timer 118 may need to be doubled.

Only if both of the measurement time counters 112 and 118 are ready, as detected by AND gate 120, will the $dF_A$ difference be actualized by loading it into actual latch 126, whose default or initial value is zero. The actual latch 126 may be configured so that its contents is available to the PLL circuitry through the use of another bit (ST) of an AFC control word that causes the contents of the actual latch 126 to be loaded into output latch 128, which outputs offset error $dF_O$. In an embodiment of external control for AFC offset determination process, the content of output latch 128 is added to a PLL frequency control word, which is inside a controller, only if an AFC control word bit for enabling offset correction is set. In one example, the output latch 128 contains seven bits so that the theoretical maximal offset frequency is 127 times the frequency resolution (e.g. 2.5-7.5 kHz, depending on the band selection).

If the AFC circuit 100 is activated, then the subsequent frequency error measurements will result in the actual frequency error being determined and output by the subtractor block 122 ($dF_S = F_T - F_{R0}$). The original receiver frequency defined in the PLL ($F_{R0}$) is not modified by the AFC, therefore the measured frequency error is accumulated using adder 124 ($dF_S + dF_O = dF_A$) to calculate the current offset frequency correction ($dF_O = F_T - F_{R0}$). When $dF_S = 0$, i.e. $dF_A = dF_O$, then the frequency error is compensated.

In order to measure frequency error, AFC circuit 100 needs valid data edges, though not necessarily a fixed preamble pattern, such as "00110011". Preferably, this pattern has equal numbers of spaces and marks to simplify the AFC circuit 100, though the circuit may be adapted to accommodate other types of patterns. In other words, the "1" and "0" periods being measured must be accurate. In a preferred embodiment, frequency modification is performed using AFC circuit 100 when the receiver recognizes a data pattern that belongs to the receiver (e.g. the receiver was addressed) or when a valid data indicator signal, such as a Receive Signal Strength Indicator (RSSI) or Data Quality Detector (DQD), reports acceptable data reception.

Examples of the estimated processing time for determining the frequency correction for different bands are:
315 MHz: 250 us
433 MHz: 250 us
868 MHz: 150 us
915 MHz: 100 us FIG. 2 illustrates an embodiment of a Frequency Shift Key (FSK) receiver system 200 utilizing the AFC circuit 100 of FIG. 1, wherein frequency error correction using AFC circuit 100 is demonstrated. FSK receiver 200 has a radio frequency (RF) section 210 that includes low noise amplifier (LNA) 212 that is configured for electrical coupling to an antenna through interface pins IN1 and IN2. LNA 212 receives and amplifies an RF signal that is output to mixers 214 and 216. Mixer 214 mixes the received signal with a first frequency to recover an I data channel from the received signal. Mixer 216 mixes the received signal with a second frequency that is in EXCLUSIVE ORed I and Q with the first frequency in order to recover a D channel from the received signal.

The I and Q data channels are input to a baseband section 230. The I channel is input to a first baseband block 232 that performs amplification, offset correction, baseband filtering and limiting or low pass filtering on the I channel. A second baseband block 234 performs the same functions for the D channel. Typically, the receiver bandwidth is selectable through programming of the bandwidth of the baseband filters, which allows the receiver characteristics to be set in accordance with the signal to be received. For example, the bandwidth can be chosen to accommodate FSK deviation, data rate and crystal tolerance requirements. A example of a low pass filter stage in the baseband blocks is a seventh order Butterworth low-pass filter with 40 dB suppression at twice the bandwidth frequency. Offset cancellation may be performed using a high-pass filter with a cut-off frequency below 7 kHz, for example. RSSI detector 238 monitors the input signal level in baseband blocks 232 or 234 and generates an RSSI signal through comparator 262 if the received signal strength exceeds a predetermined level. This RSSI signal is input to controller 270, in this example, for further processing.

A data processing and clock recovery section 240 extracts data and clock signals from the received signal. The I and Q channel data output from baseband blocks 232 and 234, respectively, is input to digital filters 242 and 244, respectively. The digitally filtered I and Q channels output by digital filters 242 and 244 are input to I/Q demodulator 246, which demodulates the I and Q channels to derive a digital data signal from the received signal, which is input to data filter and clock recovery circuit 250. The data filter and clock recovery circuit 250 uses a clock frequency that is, in this example, 29 times the bit rate to recover the received data along with a recovered clock signal that is synchronized to the received data. The clock recovery circuitry may provide different modes, such as slow, for higher noise immunity and more accurate data timing, but slower settling time as compared to fast mode. The circuit may also operate automatically, where it starts in fast mode and switches to slow mode after locking onto the recovered signal. The recovered clock signal may be used to load received data into FIFO 256. Other embodiments of receiver circuits suitable for use of AFC circuit 100 may utilize an analog approach instead of the digital approach described here.

A switch 254 permits either the unfiltered data signal from I/Q demodulator 246, through resistor 252, or the recovered data clock from data filter and clock recovery circuit 250 to be output from the receiver circuit. A Data Quality Detector 260 may be provided that counted spikes on the unfiltered received data and determine whether the number of spikes exceeds a threshold value that is predetermined or programmed into the receiver.

The I and Q inputs of AFC circuit 100 are coupled to the outputs of baseband blocks 230 and 232, respectively. The Data input of AFC circuit 100 is coupled to the data output of data filter and clock recovery circuit 250. The Xclk input of AFC circuit 100 is coupled to the output of crystal oscillator 280. Crystal oscillator 280 provides a reference clock signal, e.g. 10 MHz, to AFC circuit 100, PLL circuit 220, as well as other circuits in the receiver. Bias circuit 264 provides power and biasing to the components of the receiver circuit. This example also includes a low battery detector (LBD) 284 that provides a warning signal to controller 270 as well as a wake-up timer 282 that provides a timer signal to controller 270.

In this example, control signal ST for enabling output latch 128 of FIG. 1 is provided by controller 270. The $dF_O$ signal output from latch 128 is input to controller 270. In one example of a clock offset correction process, controller 270 senses, through either RSSI 238 or DQD 260, that a valid signal is being received by the receiver circuit. When the valid signal is detected, controller 270 enables the measurement time counters 112 and 118 in FIG. 1 through, for example, gating the clock signal from crystal oscillator 280 to the Xclk input of AFC circuit 100. Controller 270 then waits for a period sufficient to allow the timers to AFC circuit 100 to complete and the remainder of AFC circuit 100 to calculate the frequency offset value $dF_A$ before the controller 270 asserts the ST signal to latch the offset value into output latch 128. Controller 270 then receives the value of $dF_O$ output by AFC circuit 100 and adds it to the current value of the PLL frequency $F_{R0}$, which may be stored in memory in controller 270, before outputting the new offset corrected frequency value for $F_{R0}$ to PLL 220. Other implementations are possible where control of the offset correction process is performed by an external processor where a control interface is provided, e.g. for receiving a control word and outputting the value of $dF_O$, for the external processor to control the function of AFC circuit 100, the PLL 220, and other components of the receiver circuit.

Another exemplary embodiment provides for automatic operation of the AFC circuit. In automatic operation, the AFC circuit may be adapted to be automatically enabled when there is a valid data indication, e.g. from RSSI 238 or DQD 260, for an entire offset correction measurement cycle and the circuit measures the same result in two consecutive measurement cycles, for example. In such an adaptation, the AFC circuit will include a register for storing the result of the first measurement cycle and comparison logic for comparing the results of the first and second cycles and latching the offset value into the output latch if the two measured values match. Provisions may also be made for a limitation on the range of the frequency offset correction through the use of a digital limiter circuit that senses whether the offset correction value is greater that a pre-determined or selected value.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An automatic frequency control circuit for a receiver circuit, the circuit comprising:
   a first time measurement timer having a clock input configured to receive a reference clock signal, an enable input configured to receive a received data signal, and a first ready output configured to become active when the first time measurement timer counts a predetermined number of reference clock cycles when the first time measurement timer is enabled, where the first time measurement timer is enabled responsive to a first logic state of the received data signal;
   a second time measurement timer having a clock input configured to receive the reference clock signal, an enable input configured to receive the received data signal, and a second ready output configured to become active when the second time measurement timer counts the predetermined number of reference clock cycles when the second time measurement timer is enabled, where the second time measurement timer is enabled responsive to a second logic state of the received data signal;
   a first counter having a clock input configured to receive a baseband data signal of the receiver, an enable input configured to receive the received data signal, a stop input coupled to the first ready output of the first time measurement timer, and an output for a count value of the first counter, where the first counter is enabled responsive to the first logic state of the received data signal;
   a second counter having a clock input configured to receive a baseband data signal of the receiver, an enable input configured to receive the received data signal, a stop input coupled to the second ready output of the second time measurement timer, and an output for a count value of the second counter, where the second counter is enabled responsive to the second logic state of the received data signal;
   a subtractor having a first input coupled to the output of the first counter and a second input coupled to the output of the second counter, and an output for a difference of the count values of the first and second counters;
   an AND logic gate having a first input coupled to the ready output of the first time measurement counter, a second input coupled to the ready output of the second time measurement counter, and an output;
   a first latch having an input, an enable input coupled to the output of the AND logic gate, and an output;
   a second latch having an input coupled to the output of the first latch, an enable input configured to receive a control signal, and an output; and
   an adder having a first input coupled to the output of the subtractor, a second input coupled to the output of the second latch, and an output coupled to the input of the first latch.

2. The automatic frequency control circuit of claim 1, where the control signal to the second latch is provided by a controller.

3. The automatic frequency control circuit of claim 2, where the controller is configured to receive the output from the second latch, cause the value at the output of the second latch to be added to a stored frequency value for a phase-locked loop (PLL) of the receiver to obtain a corrected frequency value, and output the corrected frequency value to the PLL of the receiver.

4. The automatic frequency control circuit of claim 3, where the controller is further configured to receive a valid data indicator signal and, responsive thereto, assert the control signal to latch the second latch.

5. The automatic frequency control circuit of claim 1, where the received data signal is obtained from a data output of the receiver.

6. The automatic frequency control circuit of claim 1, where the receiver is a frequency shift key (FSK) receiver.

7. The automatic frequency control circuit of claim 1, where the baseband data signal is provided at an output of an XOR logic gate having a first input for receiving an I baseband data signal channel of the receiver, a second input for receiving a Q baseband data signal channel of the receiver.

8. The automatic frequency control circuit of claim 1, where the baseband data signal is provided by one of an I baseband data signal channel of the receiver and a Q baseband data signal channel of the receiver.

9. A method for automatic frequency correction in a receiver, the method comprising the steps of:
   recovering a received data signal from a baseband data signal;
   counting a predetermined number of reference clock cycles during a "1" state of the received data signal to measure a "1" time interval;
   counting the number of transitions in the baseband data signal during the "1" time interval to obtain a "1" count value;
   counting a predetermined number of reference clock cycles during a "0" state of the received data signal to measure a "0" time interval;
   counting the number of transitions in the baseband data signal during the "0" time interval to obtain a "0" count value;
   determining a difference between the "1" and "0" count values to obtain a difference value;

adding the difference value to a current offset value to obtain an actual offset value;

latching the actual offset value when "1" and "0" time intervals have been measured;

outputting the actual offset value responsive to a control signal;

adding the actual offset value to a stored frequency control value to obtain a corrected frequency control value; and controlling a frequency synthesizer for the receiver using the corrected frequency control value.

10. The method of claim 9, the method further comprising the step of initiating automatic frequency correction in the receiver responsive to a valid data indicator signal.

11. The method of claim 9, the method further comprising the steps of:

performing the automatic frequency correction at least twice to obtain multiple actual offset values;

comparing the multiple actual offset values; and the step of controlling a frequency synthesizer for the receiver using the actual frequency control value further comprises controlling a frequency synthesizer for the receiver using the corrected frequency control value only when the multiple actual offset values match.

12. A method for automatic frequency correction in a receiver, the method comprising the steps of:

recovering a received data signal from a baseband data signal;

counting a predetermined number of reference clock cycles during a "1" state of the received data signal to measure a "1" time interval;

counting the number of transitions in the baseband data signal during the "1" time interval to obtain a "1" count value;

counting a predetermined number of reference clock cycles during a "0" state of the received data signal to measure a "0" time interval;

counting the number of transitions in the baseband data signal during the "0" time interval to obtain a "0" count value;

determining a difference between the "1" and "0" count values to obtain a difference value;

adding the difference value to a current offset value to obtain an actual offset value;

latching the actual offset value when "1" and "0" time intervals have been measured; and outputting the actual offset value responsive to a control signal;

where the baseband data signal is one of an I baseband data signal channel of the receiver, a Q baseband data signal channel of the receiver, and an exclusive ORing of the I and Q baseband data signal channels.

13. A system for automatic frequency correction in a receiver, the system comprising:

means for determining a number of transitions in a received baseband data signal for a "1" state of a received data signal, where the received data signal and is derived from the received baseband data signal;

means for determining a number of transitions in the received baseband data signal for a "0" state of the received data signal;

means for calculating a difference between the number of transitions in the received baseband data signal for a "1" state of the received data signal and the number of transitions in the received baseband data signal for a "0" state of the received data signal to obtain a subsequent frequency offset correction value;

means for adding the subsequent frequency offset correction value to a current frequency offset correction value to obtain an actual frequency correction value;

means for capturing and storing the actual frequency correction value;

means for controlling the receiver clock frequency using the actual frequency correction value;

means for detecting valid data in the received data signal; and means for initiating automatic frequency correction responsive to detecting valid data in the received data signal.

14. A system for automatic frequency correction in a receiver, the system comprising:

means for determining a number of transitions in a received baseband data signal for a "1" state of a received data signal, where the received data signal and is derived from the received baseband data signal;

means for determining a number of transitions in the received baseband data signal for a "0" state of the received data signal;

means for calculating a difference between the number of transitions in the received baseband data signal for a "1" state of the received data signal and the number of transitions in the received baseband data signal for a "0" state of the received data signal to obtain a subsequent frequency offset correction value;

means for adding the subsequent frequency offset correction value to a current frequency offset correction value to obtain an actual frequency correction value;

means for capturing and storing the actual frequency correction value;

means for controlling the receiver clock frequency using the actual frequency correction value;

where the baseband data signal is one of an I baseband data signal channel of the receiver, a Q baseband data signal channel of the receiver, and an exclusive ORing of the I and Q baseband data signal channels.

* * * * *